US009900533B2

(12) United States Patent
Higuchi

(10) Patent No.: US 9,900,533 B2
(45) Date of Patent: Feb. 20, 2018

(54) IMAGE PROCESSING APPARATUS AND METHOD, AND IMAGE CAPTURING APPARATUS

(71) Applicant: CANON KABUSHIKI KAISHA, Tokyo (JP)

(72) Inventor: Daisuke Higuchi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/260,924

(22) Filed: Sep. 9, 2016

(65) Prior Publication Data
US 2017/0078599 A1 Mar. 16, 2017

(30) Foreign Application Priority Data

Sep. 10, 2015 (JP) ................................. 2015-178876

(51) Int. Cl.
*H04N 5/367* (2011.01)
*H04N 5/365* (2011.01)
(Continued)

(52) U.S. Cl.
CPC ....... *H04N 5/367* (2013.01); *H01L 27/14621* (2013.01); *H01L 27/14645* (2013.01);
(Continued)

(58) Field of Classification Search
CPC .. H04N 5/357–5/3675; H04N 5/2176–5/2178; H04N 5/23229;
(Continued)

(56) References Cited

U.S. PATENT DOCUMENTS 6,002,433 A * 12/1999 Watanabe .............. H04N 5/367
348/246
6,163,619 A 12/2000 Maruo
(Continued)

FOREIGN PATENT DOCUMENTS

JP 07-059011 A 3/1995
JP 2009-267593 A 11/2009

OTHER PUBLICATIONS

The above references were cited in related U.S. Appl. No. 15/260,948, filed Sep. 9, 2016 "Image Capturing Apparatus and Control Method for the Same".
(Continued)

*Primary Examiner* — Michael Osinski
(74) *Attorney, Agent, or Firm* — Cowan, Liebowitz & Latman, P.C.

(57) ABSTRACT

An image processing apparatus comprises: a memory which stores an address of a defective pixel that satisfies a predetermined condition, among defective pixels included in an image sensor covered with color filters; and a correction circuit which corrects, among pixel data of an image obtained by exposing the image sensor, the pixel data of the defective pixel at the address stored in the memory. The defective pixel is a pixel having pixel data whose difference from a value determined using the pixel data of surrounding pixels is greater than a threshold value, and the predetermined condition includes at least one of a condition that a plurality of defective pixels among pixels corresponding to different or the same color filters are adjacent to each other.

11 Claims, 10 Drawing Sheets

(51) Int. Cl.
  *H01L 27/146* (2006.01)
  *H04N 5/217* (2011.01)
  *H04N 17/00* (2006.01)
(52) U.S. Cl.
  CPC ......... *H04N 5/2178* (2013.01); *H04N 5/3655* (2013.01); *H04N 5/3656* (2013.01); *H04N 17/002* (2013.01)
(58) Field of Classification Search
  CPC .............. H04N 5/374; H01L 27/14621; H01L 27/14645; G06T 3/4015
  See application file for complete search history.

(56) References Cited

U.S. PATENT DOCUMENTS

| | | | | |
|---|---|---|---|---|
| 6,642,960 | B1* | 11/2003 | Kohashi | H04N 5/367 348/246 |
| 6,683,643 | B1 | 1/2004 | Takayama | |
| 6,724,945 | B1* | 4/2004 | Yen | G06T 5/20 348/246 |
| 7,061,533 | B1 | 6/2006 | Urushiya | |
| 7,092,018 | B1 | 8/2006 | Watanabe | |
| 7,433,547 | B2 | 10/2008 | Yamamoto | |
| 7,511,748 | B2* | 3/2009 | Kagle | H04N 5/367 348/187 |
| 7,551,204 | B2 | 6/2009 | Muraki | |
| 7,649,555 | B2* | 1/2010 | Noh | H04N 5/367 348/246 |
| 7,746,392 | B2* | 6/2010 | Hayaishi | H04N 5/3675 348/241 |
| 8,013,914 | B2* | 9/2011 | Egawa | H04N 5/367 348/241 |
| 8,054,348 | B2* | 11/2011 | Mori | H04N 5/357 348/241 |
| 8,089,537 | B2* | 1/2012 | Hoshuyama | H04N 5/3675 348/246 |
| 8,259,198 | B2* | 9/2012 | Cote | H04N 5/2176 348/237 |
| 8,310,570 | B1* | 11/2012 | Aldrich | H04N 5/367 348/246 |
| 8,451,351 | B2 | 5/2013 | Kitani | |
| 8,797,428 | B2* | 8/2014 | Ishiga | H04N 5/367 348/246 |
| 8,854,511 | B2* | 10/2014 | Kawai | H04N 5/367 348/222.1 |
| 8,891,866 | B2 | 11/2014 | Shinozaki | |
| 9,041,854 | B2* | 5/2015 | Kiyosawa | H04N 5/2178 348/347 |
| 9,197,871 | B2* | 11/2015 | Shoyama | H04N 5/367 |
| 9,635,292 | B2* | 4/2017 | Furuya | H04N 5/3675 |
| 9,693,000 | B2* | 6/2017 | Furuya | H04N 5/3675 |
| 2003/0043286 | A1 | 3/2003 | Kato | |
| 2004/0032516 | A1* | 2/2004 | Kakarala | G06T 3/4015 348/246 |
| 2004/0212705 | A1* | 10/2004 | Hsieh | H04N 5/367 348/272 |
| 2005/0219390 | A1 | 10/2005 | Tajima | |
| 2005/0231617 | A1 | 10/2005 | Kitani | |
| 2005/0253947 | A1 | 11/2005 | Kim | |
| 2006/0050158 | A1 | 3/2006 | Irie | |
| 2006/0092477 | A1 | 5/2006 | Okado | |
| 2006/0233439 | A1 | 10/2006 | Zhao | |
| 2007/0229676 | A1 | 10/2007 | Tanaka | |
| 2008/0074491 | A1 | 3/2008 | Matsui | |
| 2008/0117318 | A1 | 5/2008 | Aoki | |
| 2008/0231734 | A1 | 9/2008 | Enomoto | |
| 2008/0273101 | A1* | 11/2008 | Takenaka | H04N 5/361 348/243 |
| 2008/0273102 | A1* | 11/2008 | Hyakutake | H04N 5/367 348/246 |
| 2008/0316336 | A1* | 12/2008 | Oshima | H04N 5/3675 348/231.99 |
| 2009/0079853 | A1* | 3/2009 | Hoshuyama | H04N 5/3675 348/246 |
| 2009/0237532 | A1* | 9/2009 | Mori | H04N 5/357 348/242 |
| 2010/0026862 | A1* | 2/2010 | Nishiwaki | H04N 9/045 348/246 |
| 2010/0066872 | A1 | 3/2010 | Yamaguchi | |
| 2010/0079629 | A1* | 4/2010 | Park | H04N 9/045 348/246 |
| 2011/0032393 | A1 | 2/2011 | Yamaguchi | |
| 2011/0080505 | A1* | 4/2011 | Ogino | H04N 5/365 348/246 |
| 2011/0102649 | A1* | 5/2011 | Hashizume | H04N 5/3675 348/246 |
| 2011/0234842 | A1* | 9/2011 | Ishiga | H04N 5/367 348/223.1 |
| 2012/0020541 | A1 | 1/2012 | Hayashida | |
| 2012/0281123 | A1* | 11/2012 | Hoda | H04N 5/3675 348/246 |
| 2013/0027594 | A1 | 1/2013 | Krymski | |
| 2013/0128082 | A1* | 5/2013 | Kiyosawa | H04N 5/2178 348/246 |
| 2013/0208974 | A1* | 8/2013 | Nakano | G06T 7/001 382/149 |
| 2014/0016005 | A1 | 1/2014 | Kishima | |
| 2014/0125847 | A1 | 5/2014 | Yasuda | |
| 2015/0070536 | A1 | 3/2015 | Sasaki | |
| 2015/0116566 | A1* | 4/2015 | Yamamoto | H04N 5/367 348/308 |
| 2015/0156405 | A1 | 6/2015 | Izawa | |
| 2015/0181148 | A1 | 6/2015 | Slovick | |
| 2015/0244953 | A1* | 8/2015 | Furuya | H04N 5/3696 348/246 |
| 2015/0244956 | A1* | 8/2015 | Furuya | H04N 5/3675 348/246 |
| 2016/0006960 | A1 | 1/2016 | Takahashi | |
| 2016/0127667 | A1 | 5/2016 | Lin | |
| 2017/0053577 | A1 | 2/2017 | Cao | |
| 2017/0070692 | A1 | 3/2017 | Lin | |
| 2017/0078599 | A1 | 3/2017 | Higuchi | |
| 2017/0148141 | A1 | 5/2017 | Lin | |
| 2017/0230634 | A1 | 8/2017 | Takenouchi | |
| 2017/0318244 | A1 | 11/2017 | Koskinen | |

OTHER PUBLICATIONS

The above patent documents were cited in an Office Action dated Jul. 13, 2017, that issued in a related U.S. Appl. No. 15/260,948.
The above patent documents were cited in an Notice of Allowance dated Dec. 7, 2017, that issued in U.S. Appl. No. 15/260,948.

* cited by examiner

FIG. 2

| R | Gr | R | Gr |
|---|----|---|----|
| Gb | B | Gb | B |
| R | Gr | R | Gr |
| Gb | B | Gb | B |

| B | Gb | B | Gb | B | Gb | B |
| Gr | R11 | Gr | R12 | Gr | R13 | Gr |
| B | Gb | B | Gb | B | Gb | B |
| Gr | R21 | Gr | R22 | Gr | R23 | Gr |
| B | Gb | B | Gb | B | Gb | B |
| Gr | R31 | Gr | R32 | Gr | R33 | Gr |
| B | Gb | B | Gb | B | Gb | B |

FIG. 7A
FIG. 7C
FIG. 7B
FIG. 7D
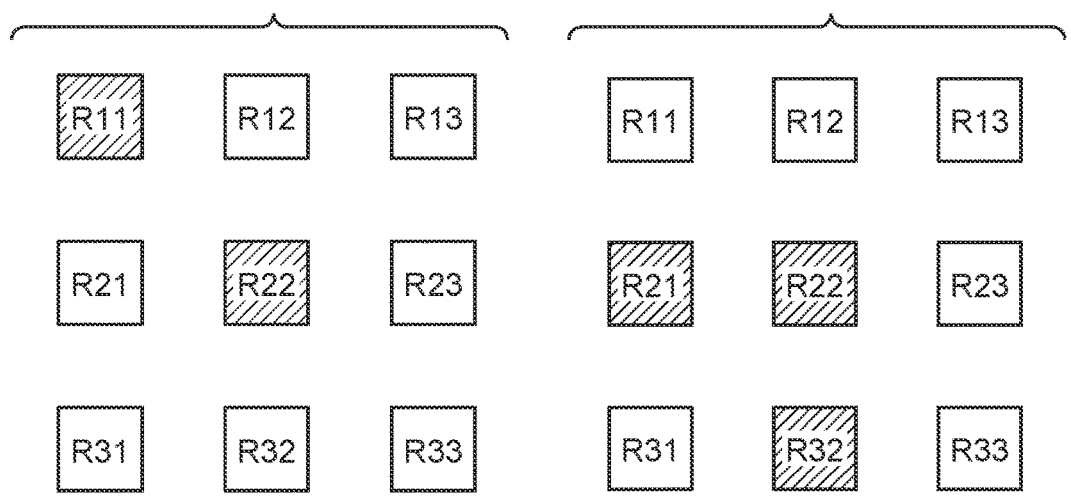
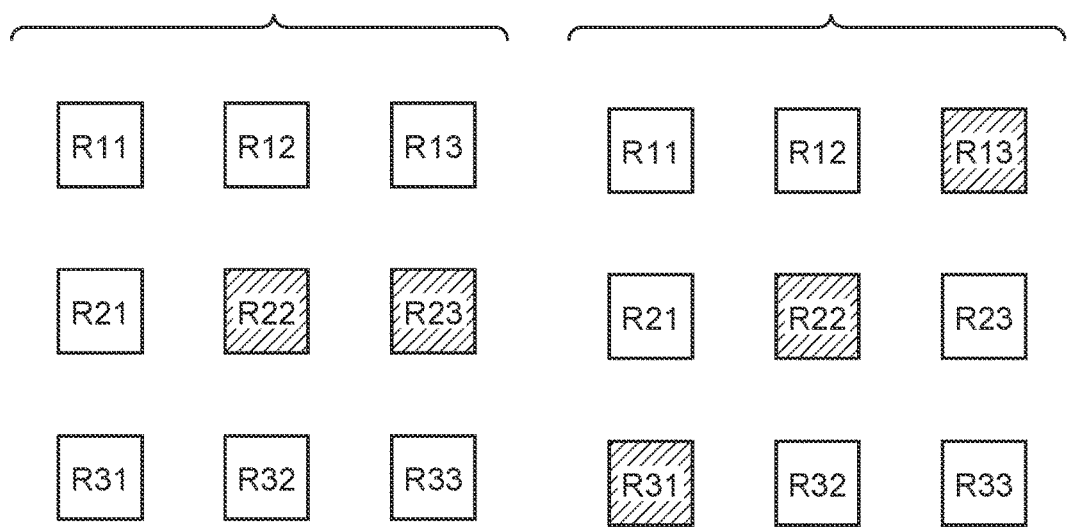

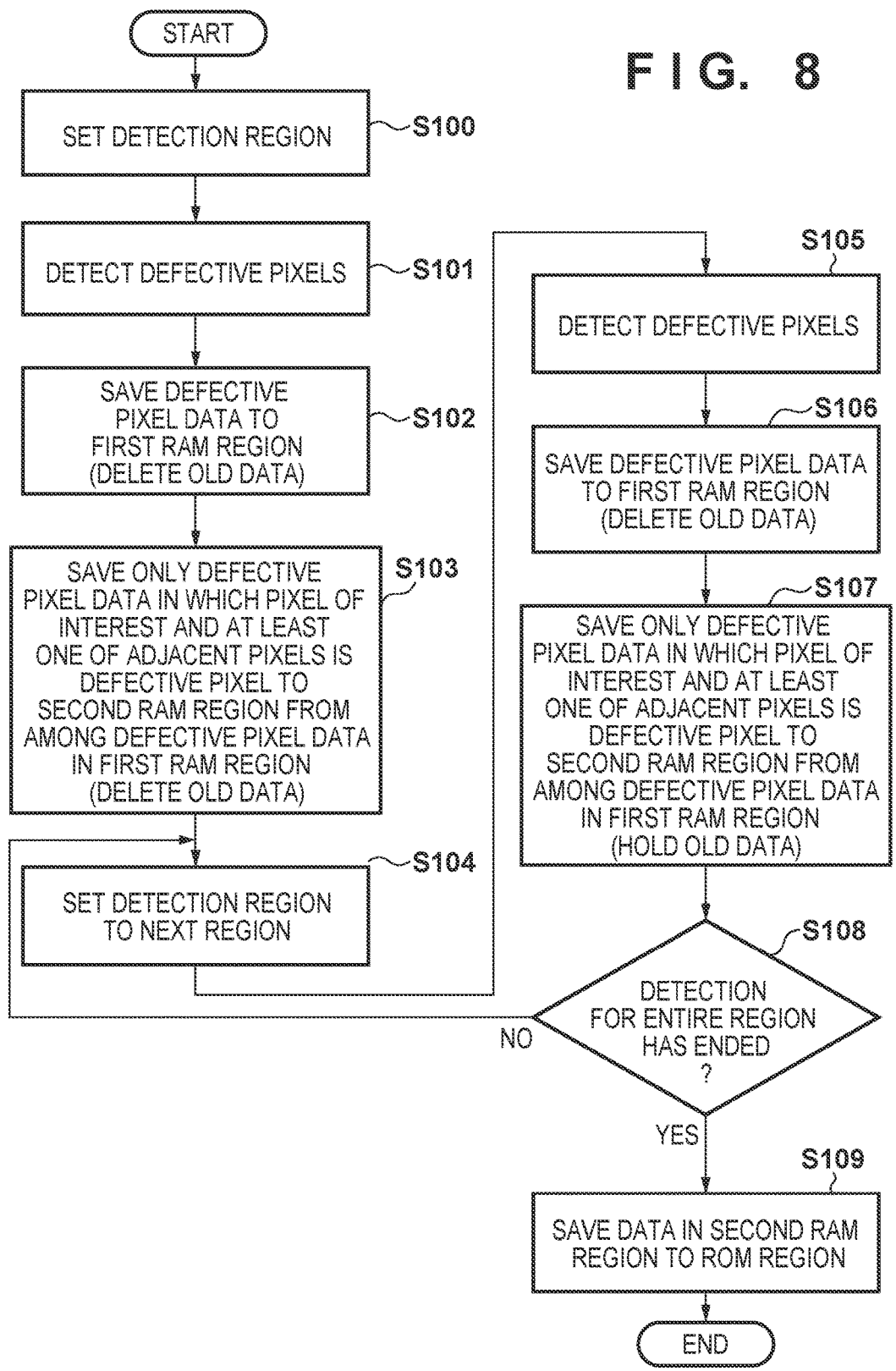

IMAGE PROCESSING APPARATUS AND METHOD, AND IMAGE CAPTURING APPARATUS

BACKGROUND OF THE INVENTION

Field of the Invention

The present invention relates to an image processing apparatus and method, and to an image capturing apparatus.

Description of the Related Art

In recent years, television standards have been changing from a resolution of 1920 horizontal pixels by 1080 vertical pixels (1920×1080 pixels) called full high definition to a resolution of 3840×2160 pixels called 4k2k, which is four times the pixel number of HD. Moreover, as a next generation standard after 4k2k, there is also a standard called 8k4k or super high definition, and according to this standard, the pixel number is as much as 7680×4320 pixels.

On the other hand, with the increase in the pixel number, the total number of defective pixels in CMOS sensors has also been increasing. In general, in order to correct signals of defective pixels, defective pixel information is stored in the memory of the camera body, and signals of the defective pixels are corrected using this data at the time of shooting. However, the memory capable of storing the defective pixel information is limited, and in the case where a large number of defective pixels exist, the information for all of the defective pixels cannot be stored in the memory.

Japanese Patent Laid-Open No. 07-059011 discloses a technique for efficiently using a limited memory by comparing the data of a defective pixel stored in the memory with the data of a newly detected defective pixel, and storing the data of the defective pixel having the higher level in the memory.

However, in Japanese Patent Laid-Open No. 07-059011, defective pixels having a high level can be corrected, but there are cases where the data of defective pixels having a low level cannot be stored in the memory, and thus these defective pixels cannot be corrected.

SUMMARY OF THE INVENTION

The present invention has been made in consideration of the above situation, and corrects the signals of a greater number of defective pixels having a lower level in an image obtained by shooting.

According to the present invention, provided is an image processing apparatus comprising: a memory which stores an address of a defective pixel that satisfies a predetermined condition, among defective pixels included in an image sensor having a plurality of pixels covered with color filters; and a correction circuit which corrects, among pixel data of an image obtained by exposing the image sensor, the pixel data of the defective pixel at the address stored in the memory, wherein the defective pixel is a pixel having pixel data whose difference from a value determined using the pixel data of pixels surrounding the pixel is greater than a threshold value, and the predetermined condition includes at least one of a condition that a plurality of defective pixels among pixels corresponding to different color filters are adjacent to each other, and a condition that a plurality of defective pixels among pixels corresponding to the same color filter are adjacent to each other.

Further, according to the present invention, provided is an image processing apparatus comprising: a memory which stores an address of a defective pixel whose defective level is included in a predetermined range and that satisfies a predetermine condition, among defective pixels included in an image sensor having a plurality of pixels covered with color filters; and a correction circuit which corrects, among pixel data of an image obtained by exposing the image sensor, the pixel data of the defective pixel at the address stored in the memory, wherein the defective pixel is a pixel having pixel data whose difference from a value determined using the pixel data of pixels surrounding the pixel is greater than a threshold value, and the predetermined condition includes at least one of a condition that a plurality of defective pixels among pixels corresponding to different color filters are adjacent to each other, and a condition that a plurality of defective pixels among pixels corresponding to the same color filter are adjacent to each other.

Furthermore, according to the present invention, provided is an image capturing apparatus comprising: an image sensor which has a plurality of pixels covered with color filters; a memory which stores an address of a defective pixel that satisfies a predetermined condition, among defective pixels included in the image sensor; and a correction circuit which corrects, among pixel data of an image obtained by exposing the image sensor, the pixel data of the defective pixel at the address stored in the memory, wherein the defective pixel is a pixel having pixel data whose difference from a value determined using the pixel data of pixels surrounding the pixel is greater than a threshold value, and the predetermined condition includes at least one of a condition that a plurality of defective pixels among pixels corresponding to different color filters are adjacent to each other, and a condition that a plurality of defective pixels among pixels corresponding to the same color filter are adjacent to each other.

Further, according to the present invention, provided is an image processing method comprising: storing, in a memory, an address of a defective pixel that satisfies a predetermined condition, among defective pixels included in an image sensor having a plurality of pixels covered with color filters; and correcting, among pixel data of an image obtained by exposing the image sensor, the pixel data of the defective pixel at the address stored in the memory, wherein the defective pixel is a pixel having pixel data whose difference from a value determined using the pixel data of pixels surrounding the pixel is greater than a threshold value, and the predetermined condition includes at least one of a condition that a plurality of defective pixels among pixels corresponding to different color filters are adjacent to each other, and a condition that a plurality of defective pixels among pixels corresponding to the same color filter are adjacent to each other.

Further, according to the present invention, provided is an image processing method comprising: storing, in a memory, an address of a defective pixel whose defective level is included in a predetermined range and that satisfies a predetermined condition, among defective pixels included in an image sensor having a plurality of pixels covered with color filters; and correcting, among pixel data of an image obtained by exposing the image sensor, the pixel data of the defective pixel at the address stored in the memory, wherein the defective pixel is a pixel having pixel data whose difference from a value determined using the pixel data of pixels surrounding the pixel is greater than a threshold value, and the predetermined condition includes at least one of a condition that a plurality of defective pixels among pixels corresponding to different color filters are adjacent to each other, and a condition that a plurality of defective pixels among pixels corresponding to the same color filter are adjacent to each other.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIG. 2 is a diagram showing an example of a pixel configuration according to the embodiments;

FIGS. 7A to 7D are diagrams illustrating an example of defective pixel data stored according to a second RAM region according to the embodiments;

FIG. 8 is a flowchart of defective pixel detection processing by the first defective pixel detection method according to the first embodiment;

DESCRIPTION OF THE EMBODIMENTS

Exemplary embodiments of the present invention will be described in detail in accordance with the accompanying drawings.

First Embodiment

Figure 1:
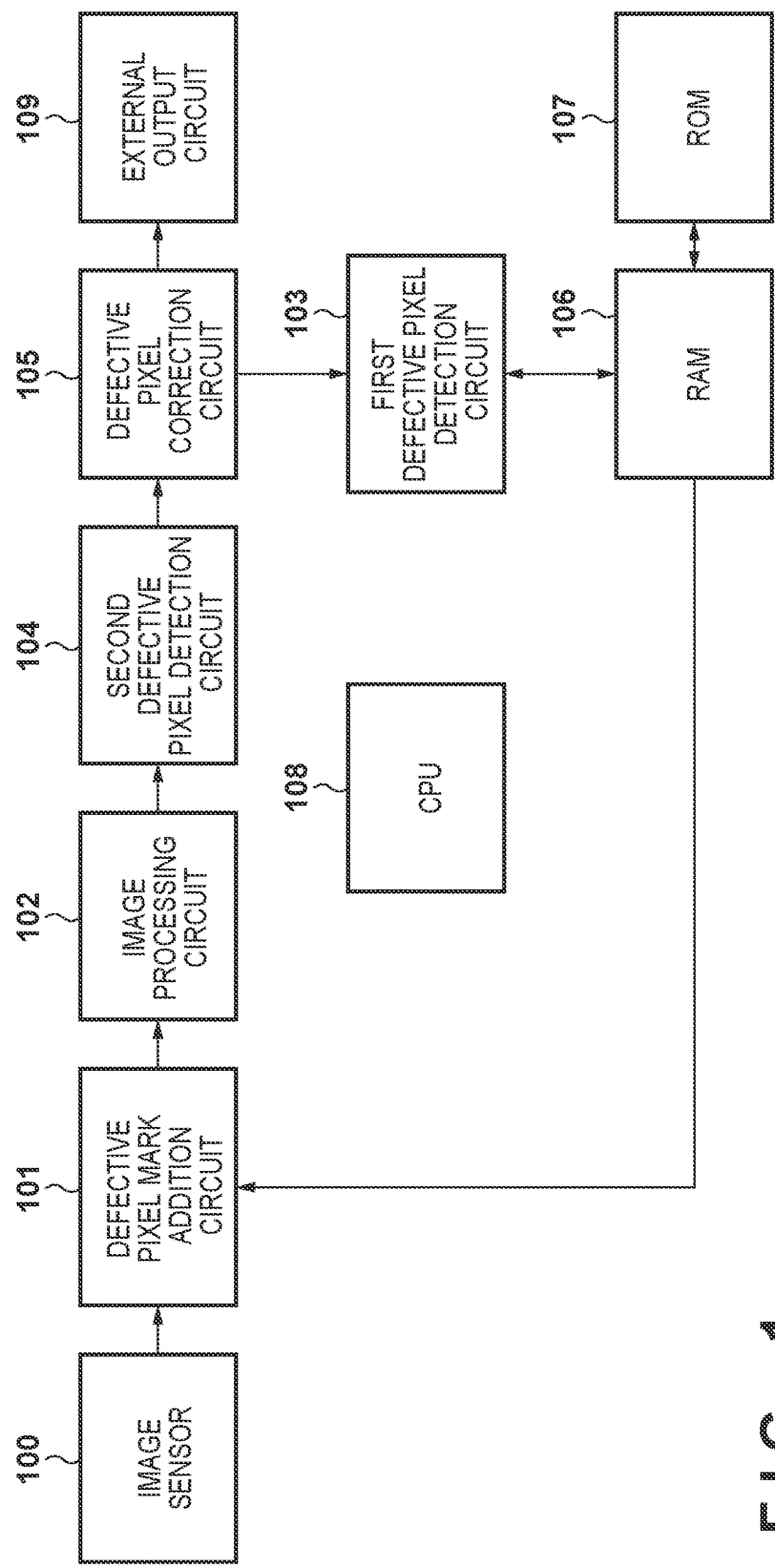
FIG. 1 is a block diagram showing a system configuration of an image capturing apparatus according to embodiments of the present invention.

FIG. 1 is a block diagram showing a schematic configuration of an image capturing apparatus according to embodiments of the present invention. The image capturing apparatus in FIG. 1 includes an image sensor 100, a defective pixel mark addition circuit 101, an image processing circuit 102, a first defective pixel detection circuit 103, a second defective pixel detection circuit 104, a defective pixel correction circuit 105, a RAM 106, a ROM 107, a CPU 108 and an external output circuit 109.

The image sensor 100 is a CMOS image sensor in which a parallel AD converter is implemented, and has a plurality of pixels covered with color filters in a Bayer array. Some of the pixels of the image sensor 100 are affected by variation in the device manufacturing process, degradation over time and the like, and become defective pixels whose output does not take a desired value. The defective pixel mark addition circuit 101 is a circuit for adding a defective pixel mark to a pixel at an address at which correction is to be performed, in an image input from the image sensor 100. Note that this address is acquired by reading defective pixel data that was detected by the first defective pixel detection circuit 103 by processing that will be described later and stored in the RAM 106. The image processing circuit 102 performs processing such as correction of offset variation and gain variation of images.

The second defective pixel detection circuit 104 performs defective pixel detection on image data that has been input, by a second defective pixel detection method to be described later, and sends defective pixel data such as the address and characteristic data to the defective pixel correction circuit 105. When performing defective pixel detection by the second defective pixel detection circuit 104, the image sensor 100 is exposed, and the detection is performed on an image obtained by normal shooting, instead of performing the detection under a specific environment as in the case of the first defective pixel detection circuit 103 to be described later.

The defective pixel correction circuit 105 corrects the image data of pixels having a defective pixel mark added by the defective pixel mark addition circuit 101, and the image data of pixels detected by the second defective pixel detection circuit 104, using the image data of the surrounding pixels. In the case where, however, the surrounding pixels include defective pixels, correction is performed using pixels other than those pixels. Note that regarding the defective pixel correction method, a known method can be used, and thus detailed description is omitted here. The external output circuit 109 performs necessary calculations on the image that underwent defective pixel correction by the defective pixel correction circuit 105, and after that, outputs the image to the outside of the image capturing apparatus.

Meanwhile, the first defective pixel detection circuit 103 performs defective pixel detection on image data that has been input, by a first defective pixel detection method that will be described later, and stores defective pixel data including the address and characteristic data in the RAM 106. When defective pixel detection is performed by the first defective pixel detection circuit 103, shooting and signal processing are performed under a specific environment, such as an environment in which the lens is shielded from light and a gain is increased, or an environment in which illumination light having a uniform luminance level is irradiated, such that defective pixels are easily identified. Note that in the case where defective pixel detection is performed by the first defective pixel detection circuit 103, it is not necessary to perform defective pixel mark addition by the defective pixel mark addition circuit 101, defective pixel detection by the second defective pixel detection circuit 104 and defective pixel correction by the defective pixel correction circuit 105. In the case where such processing is performed, defective pixels other than previously detected defective pixels can be detected, and in the case where such processing is not performed, currently occurring defective pixels including previously detected defective pixels can be detected, either of which can be selected. Moreover, defective pixel detection by the first defective pixel detection circuit 103 is performed in cases such as where an instruction is given by the user via an operation unit (not illustrated), where an instruction is automatically given every time a predetermined use time has elapsed, and so on.

The RAM 106 stores the defective pixel data obtained by the first defective pixel detection circuit 103. The defective pixel data placed on the RAM 106 is copied and stored in a ROM 107. A CPU 108 performs calculation on the data in the RAM 106, and controls other circuits.

Figure 2:
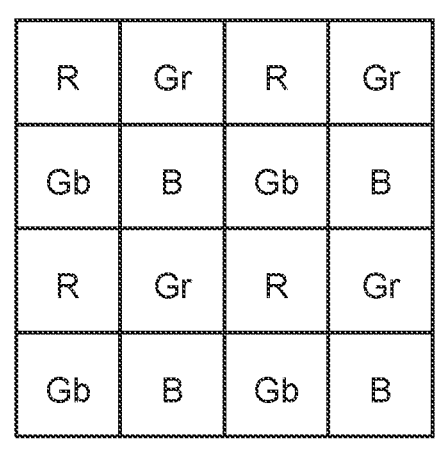

FIG. 2 is a diagram showing an example of the pixel configuration of the image sensor 100. The image sensor 100 is constituted by pixels having color filters in a Bayer array, and three types of color filters of R, G and B are used. In FIG. 2, the color filters of G pixels in the same row as R pixels are written as Gr, and the color filters of G pixels in the same row as B pixels are written as Gb, but function as color filters having the same characteristics. Also, FIG. 2 shows only a portion of pixels (4×4 pixels), but there are, in actually, 4096×2160 pixels, for example, arranged in the same manner.

Figures 3A, 3B:
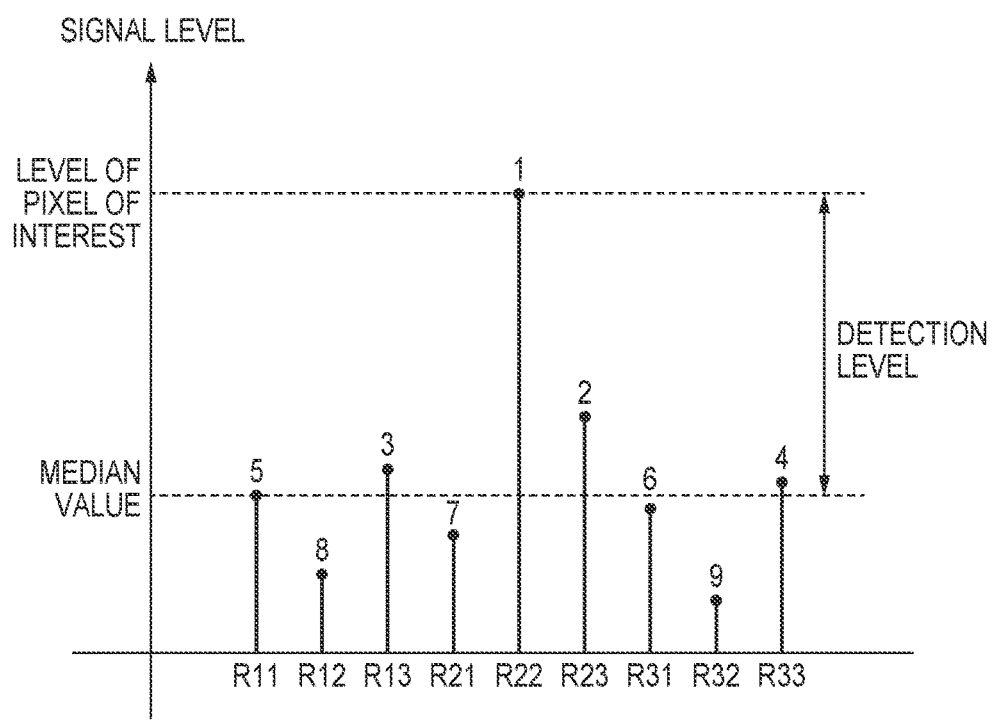
FIGS. 3A and 3B are diagrams for explaining a first defective pixel detection method according to a first embodiment.

Next, the first defective pixel detection method performed by the first defective pixel detection circuit 103 will be described with reference to FIGS. 3A and 3B. In FIG. 3A, reference numeral R22 denotes a pixel of interest targeted for defective pixel detection, and reference numerals R11, R12, R13, R21, R23, R31, R32 and R33 denote pixels that have the same color as the pixel of interest and are adjacent to the pixel of interest. The first defective pixel detection circuit 103 refers to these 3×3 pixels having the same color at the time of defective pixel detection. Here, the R pixels are used as an example, but regarding the Gr, Gb and B pixels, detection is performed by a similar method.

FIG. 3B is a diagram showing an example in which the abscissa indicates information specifying pixels, and the ordinate indicates the pixel signal level. Also, numerical values displayed in the upper part of the bar graph in FIG. 3B indicate the order of the respective magnitudes of the signal levels of the 3×3 pixels. The first defective pixel detection circuit 103 acquires the signal level of a pixel of interest denoted by R22. Next, among the nine pixels, for example, a pixel (in this example, R11) having an intermediate signal level (intermediate value) such as a median value is selected, and the signal level is acquired. Note that the acquired signal level will be described as a median value below. As described above, when the first defective pixel detection circuit 103 performs defective pixel detection, in the case where the pixel of interest R22 is not a defective pixel, the difference from the median value is predicted to be small. In view of this, the difference (detection level) between the signal level of the pixel of interest and the median value is compared to a threshold value for determining a defective pixel, and in the case where the detection level is greater than the threshold value (the condition is satisfied), the pixel of interest is determined as a defective pixel.

Figure 4:
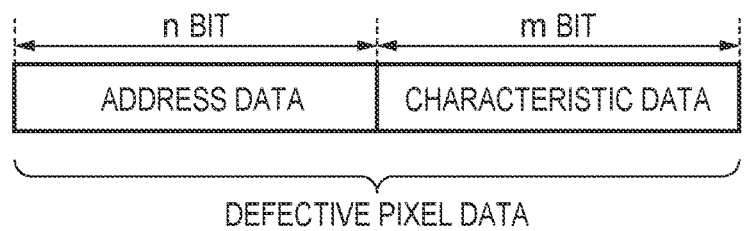
FIG. 4 is a diagram showing an example of defective pixel data according to the embodiments.

FIG. 4 shows the format of the defective pixel data of a defective pixel detected by the first defective pixel detection circuit 103. The (n+m) bits of the defective pixel data represent information of one defective pixel. The upper-order n bits represent the address data of the defective pixel, and indicate where on the surface of the image the defective pixel exists. The address data may be represented by an absolute address expressed by an (H,V) address, or may be represented by a relative address obtained by relatively counting the number of pixels from the top left of the screen or from immediately preceding data. The lower-order m bits represent the characteristic data of the defective pixel, and indicate the type of the defective pixel, the level of the defective pixel and the like.

Figure 5:
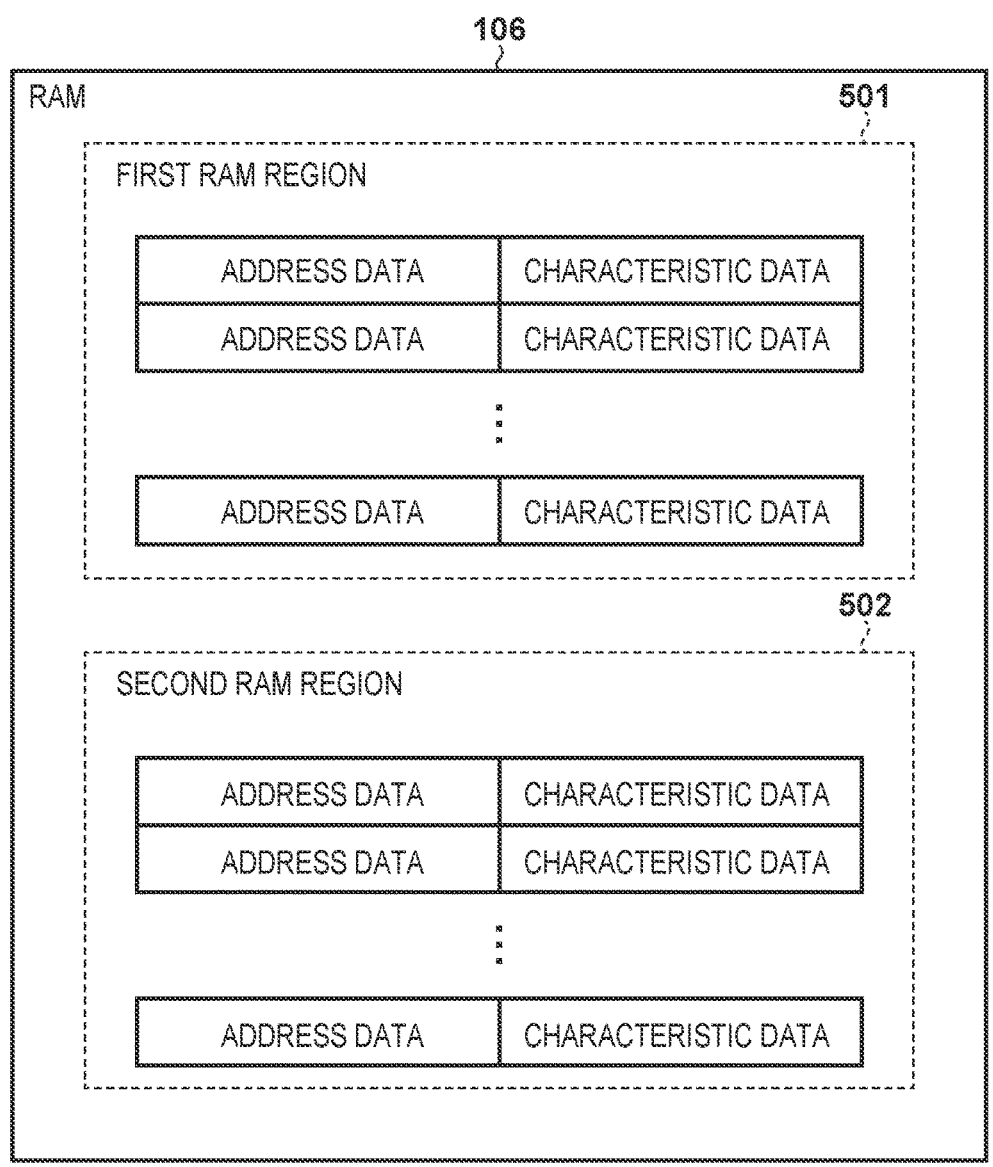
FIG. 5 is a diagram illustrating defective pixel data stored in a RAM according to the embodiments.

FIG. 5 is a diagram illustrating defective pixel data stored in the RAM 106. The RAM 106 has two regions, namely, a first RAM region 501 and a second RAM region 502. The first RAM region 501 temporarily stores the defective pixel data detected by the first defective pixel detection circuit 103. The second RAM region 502 stores only data selected by a method to be described later, among data stored in the first RAM region 501.

Figure 6:
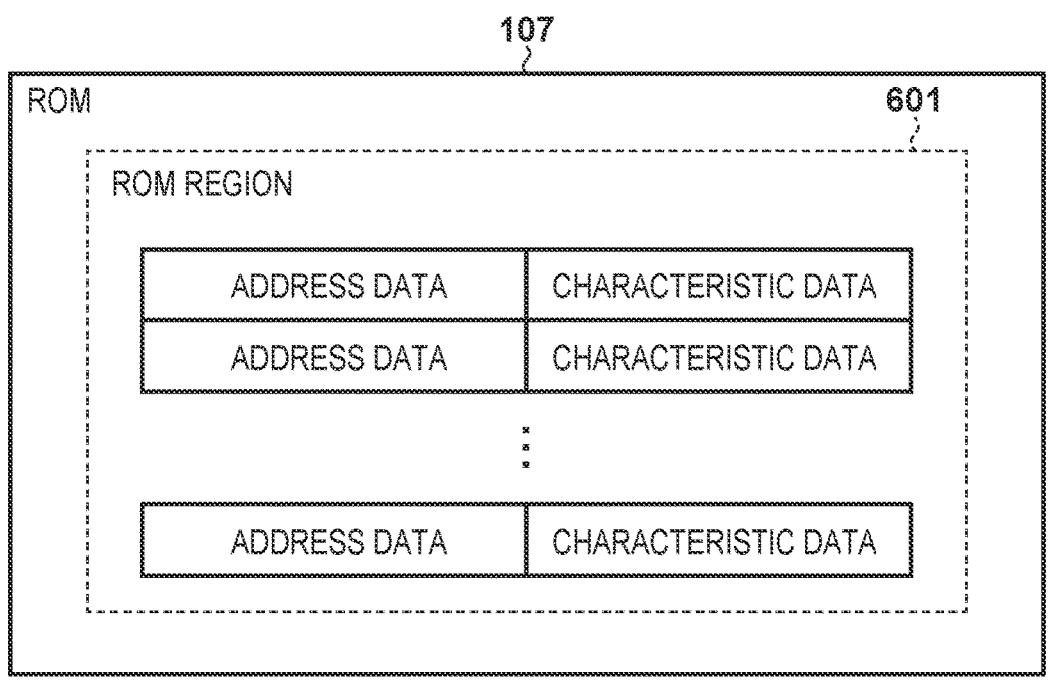
FIG. 6 is a diagram illustrating defective pixel data stored in a ROM according to the embodiments.

FIG. 6 is a diagram illustrating defective pixel data stored in the ROM 107. A ROM region 601 of the ROM 107 stores a copy of the defective pixel data stored in the second RAM region 502 of the RAM 106. The defective pixel data stored in the ROM 107 is thereby held after the power supply of the image capturing apparatus body is turned off and the data in the RAM 106 has been deleted.

FIGS. 7A to 7D show an example of data that is stored in the second RAM region 502 of the RAM 106. Among defective pixel data in the first RAM region 501, only defective pixel data in which the pixel of interest is a defective pixel and at least one of the adjacent pixels is a defective pixel is selected and stored in the second RAM region 502. Note that the adjacent pixels here refer to the eight pixels having the same color, namely, the pixels R11, R12, R13, R21, R23, R31, R32 and R33, when the pixel R22 in FIGS. 3A and 3B is the pixel of interest. Note that the adjacent pixels may refer to the eight G and B pixels adjacent to the pixel of interest R22.

FIG. 7A shows an example in which the pixel of interest R22 is a defective pixel, and the pixel R11 adjacent thereto on the upper left is also a defective pixel. FIG. 7B shows an example in which the pixel of interest R22 is a defective pixel, and the pixel R23 adjacent thereto on the right is also a defective pixel. FIG. 7C shows an example in which the pixel of interest R22 is a defective pixel, and the pixel R21 adjacent thereto on the left and the pixel R32 adjacent thereto below are also defective pixels. FIG. 7D shows an example in which the pixel of interest R22 is a defective pixel, and the pixel R13 adjacent thereto on the upper right and the pixel R31 adjacent thereto on the lower left are also defective pixels. In this manner, in the case where a pixel of interest is a defective pixel and at least one of the surrounding pixels is a defective pixel, the defective pixel data of the pixel of interest is selected and stored in the second RAM region 502.

FIG. 8 shows a flowchart of defective pixel detection processing by the first defective pixel detection method performed by the first defective pixel detection circuit 103 in the first embodiment. In step S100, first, an upper left area portion of an input image is set as a defective pixel detection region. Note that the detection region will be described later in detail with reference to FIG. 9. Next, in step S101, the first defective pixel detection circuit 103 performs defective pixel detection by sequentially performing the processing described above with reference to FIGS. 3A and 3B, on each of the pixels in the detection region set in step S100.

In step S102, the defective pixel data detected in step S101 is stored in the first RAM region 501 of the RAM 106. At this time, the data originally stored in the first RAM region 501 is deleted, and only the data detected in step S101 is stored. In step S103, defective pixel data in which the pixel of interest is a defective pixel and at least one of the adjacent pixels is a defective pixel, such as is shown in FIGS. 7A to 7D, is selected from among the defective pixel data in the first RAM region 501 of the RAM 106. Only the selected defective pixel data is then stored in the second RAM region 502 of the RAM 106. At this time, the data originally stored in the second RAM region 502 is deleted, and only the data selected in step S103 is stored.

In step S104, the next region is set as a detection region. In step S105, defective pixel detection is performed similarly to step S101 on the detection region set in step S104.

In step S106, the defective pixel data detected in step S105 is stored in the first RAM region 501 of the RAM 106. At this time, the data originally stored in the first RAM region 501 is deleted, and only the data detected in step S105 is stored. In step S107, defective pixel data in which the pixel of interest is a defective pixel and at least one of the adjacent pixels is a defective pixel, such as is shown in FIGS. 7A to 7D, is selected from among the defective pixel data in the first RAM region 501 of the RAM 106. Only the selected defective pixel data is then stored in the second RAM region 502 of the RAM 106. At this time, the data selected in step S107 is stored, in addition to any data stored in the second RAM region 502.

In step S108, it is checked whether or not defective pixel detection for the entire region has ended. In the case where defective pixel detection has not ended for the entire region, the procedure returns to step S104, and defective pixel detection is performed on the next detection region. In the case where it is determined in step S108 that defective pixel detection has ended for the entire region, the procedure advances to step S109, where the data stored in the second RAM region 502 of the RAM 106 is copied and stored in the ROM region 601 of the ROM 107, and the processing ends.

Figure 9:
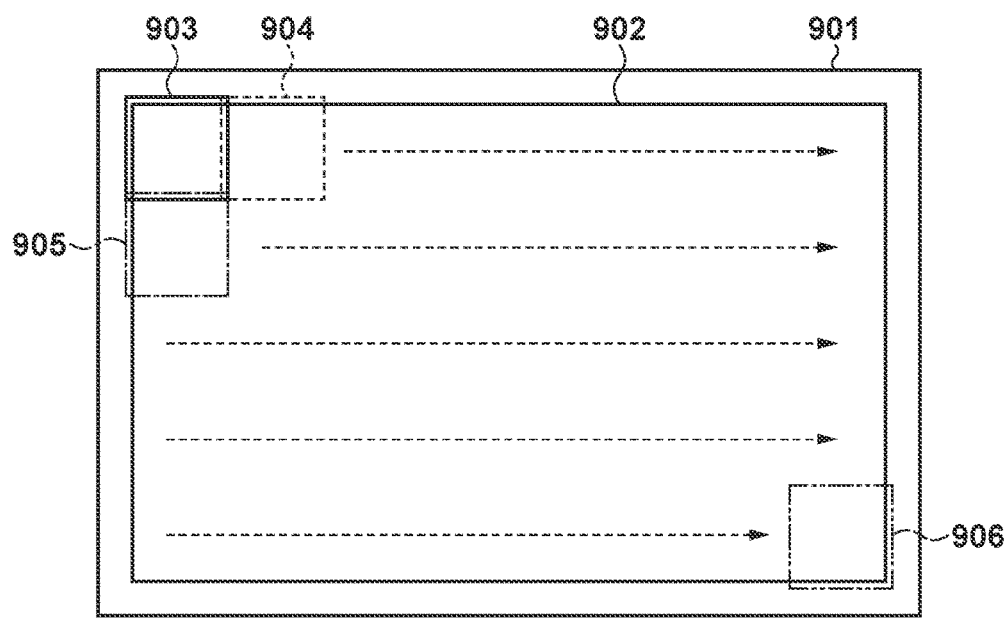
FIG. 9 is a diagram illustrating defective pixel detection regions according to the first embodiment.

Next, the defective pixel detection regions set in steps S100 and S104 in FIG. 8 will be described with reference to FIG. 9. Reference numeral 901 denotes all the pixels of the image that are input to the first defective pixel detection circuit 103. Reference numeral 902 denotes the region targeted for defective pixel detection among all the pixels 901 that are input to the first defective pixel detection circuit 103. The defective pixel detection target region 902 is determined depending upon pixels to be used in a downstream circuit, pixels that are to be stored, and the like.

A detection region 903 is a region in which defective pixel detection is performed the first time, and is set in step S100 in FIG. 8. The detection region 903 includes the region targeted for detection the first time, and in addition, an extra pixel region for one same color pixel above, below, on the right and on the left of the region. This is necessary in the processing in step S103 in order to determine whether or not the surrounding pixels are defective pixels. In addition, the size of the detection region 903 is set such that defective pixel data of a detected defective pixel is stored in the first RAM region 501 of the RAM 106. For example, in the case where a threshold value used for defective pixel detection by the first defective pixel detection circuit 103 is desired to be a small value, the detection region 903 is also set to a small range. This is because the smaller the threshold value is set to be, the more the pixels are detected as defective pixels.

Reference numeral 904 denotes a detection region set the second time, and the detection region 904 is set in step S104 in FIG. 8. The pixels in the left edge portion of the detection region 904 overlap the detection region 903 that was set the previous time. This is necessary in the processing in step S107 in order to determine whether or not the surrounding pixels are defective pixels. As described above, when setting a detection region, the next detection region is set such that a portion of the pixels of the next detection region overlaps the previous detection region.

After defective pixel detection is performed on the detection region 904, the detection region is moved in the horizontal direction, and defective pixel detection is repeatedly performed. When defective pixel detection at the uppermost stage in the horizontal direction ends, the region is moved in the vertical direction, and a detection region 905 is set. The pixels of a portion of the detection region 905 overlap an upper portion of the detection region 903. This is necessary in the processing in step S107 in order to determine whether or not the surrounding pixels are defective pixels. Subsequently, after the detection region is moved in the horizontal direction in a similar manner, the detection region is then shifted in the vertical direction, and defective pixel detection processing is performed. This is repeated, and lastly, a detection region 906 is set. Defective pixel detection is performed here also on an extra pixel region for one same color pixel above, below, on the right and on the left of the detection region, such that it can be determined whether or not the surrounding pixels are defective pixels in the processing in step S107. When defective pixel detection in the detection region 906 ends, detection for the entire region of the defective pixel detection target region 902 ends.

Figure 10:
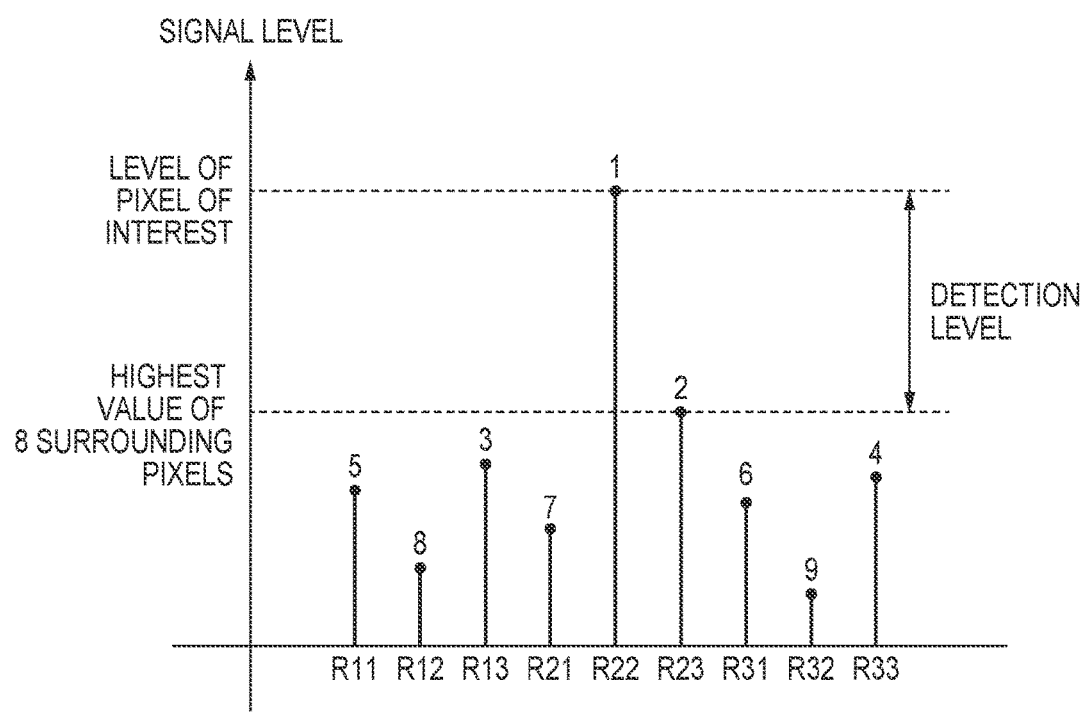
FIG. 10 is a diagram for explaining a second defective pixel detection method according to the first embodiment.

Next, the second defective pixel detection method performed by the second defective pixel detection circuit 104 will be described with reference to FIG. 10. FIG. 10 is a diagram showing an example in which the abscissa indicates information specifying pixels, and the ordinate indicates the pixel signal level. Regarding reference numerals R11 to R33 in FIG. 10, the reference numeral R22 denotes a pixel of interest, and the reference numerals R11, R12, R13, R21, R23, R31, R32 and R33 denote the eight pixels adjacent to and having the same color as the pixel of interest R22, similarly to the reference numerals shown in FIG. 3A. Note that those reference numerals may denote the eight G and B pixels adjacent to the pixel of interest R22. In addition, numerical values displayed in the upper part of the bar graph in FIG. 10 indicate the order of the respective magnitudes of the signal levels of the 3×3 pixels.

In the second defective pixel detection circuit 104, the level of the pixel of interest R22 is obtained. Next, among the eight adjacent pixels, the pixel having the highest value (in this example, R23) is selected, and the level thereof is obtained. The difference (detection level) between the level of the pixel of interest R22 and the largest value of the eight adjacent pixels is then compared to a threshold value for determining a defective pixel, and in the case where the detection level is higher than the threshold value, the pixel of interest R22 is determined as a defective pixel. In the case where the pixel of interest R22 is determined as a defective pixel, the information thereof is transmitted to the defective pixel correction circuit 105, and the pixel is corrected by the defective pixel correction circuit 105.

The result of the detection by the second defective pixel detection circuit 104 does not need to be saved to the RAM 106 and the ROM 107, and thus there is no limitation on the number of defective pixels that are detected. Moreover, as described above, detection by the second defective pixel detection circuit 104 is performed by comparing the level of the pixel of interest to the largest value of the eight adjacent pixels, and thus among the eight adjacent pixels, only the pixel having the highest level is detected. This is in order to detect only pixels that are clearly defective pixels, because the image targeted for detection by the second defective pixel detection circuit 104 is an image that is currently being shot.

Note that in the case where the second defective pixel detection circuit 104 performs defective pixel detection further using the first defective pixel detection method, the possibility that a wrong pixel is detected as being defective increases depending on the object that is shot, and there are cases where the image quality deteriorates by mistakenly performing correction. Therefore, performing defective pixel detection by both the first defective pixel detection method and the second defective pixel detection method on an image that is being shot using only the second defective pixel detection circuit 104 and correcting detected defective pixels is not realistic when product performance is taken into consideration.

As described above, in this first embodiment, only defective pixels that have at least one adjacent pixel that is a defective pixel are targeted for defective pixel detection by the first defective pixel detection circuit 103 using image data obtained by shielding the image sensor from light. This makes it possible to store and correct more defective pixels having a lower level than a conventional method, with the same memory capacity. In addition, as a result of the second defective pixel detection circuit 104 detecting and correcting isolated defective pixels, defective pixels that could not be detected by the first defective pixel detection circuit 103 can be corrected.

Note that the detection method by the first defective pixel detection circuit 103 and the detection method by the second defective pixel detection circuit 104, which are described in the first embodiment, are examples, and other methods may be used. In the first embodiment, it is important for the first defective pixel detection circuit 103 to detect defective pixels having specific characteristics that cannot be detected by the second defective pixel detection circuit 104, and the detection method is not limited to the above-described examples.

Moreover, the method described in the above-described first embodiment may be used in combination with a conventional method. For example, using the conventional method, all the defective pixels having a high level are detected. Next, using the first defective pixel detection method, among defective pixels having a low level, only defective pixels having an adjacent pixel that is also a defective pixel are detected. This enables both the defective pixel data of all defective pixels having a high level and the defective pixel data of defective pixels having a low level that have an adjacent pixel that is also a defective pixel to be stored even with a limited memory capacity, for example.

The defective pixel data obtained in this manner can be used as follows. For example, in the case where a gain to be applied to a shot image is small, all the defective pixels having a high level are corrected using only data detected by the first defective pixel detection circuit 103. On the other hand, in the case where the gain is large, defective pixels having an adjacent pixel that is also a defective pixel, among the defective pixels detected by the first defective pixel detection circuit 103, are corrected, and single defective pixels detected by the second defective pixel detection circuit 104 are also corrected. Accordingly, in the case where the gain is small, the second defective pixel detection circuit 104 does not need to perform correction, and thus image quality deterioration can be suppressed to the minimum level. Moreover, in the case where the gain is large, the first defective pixel detection circuit 103 and the second defective pixel detection circuit 104 are used in combination, and it becomes possible to correct all the defective pixels having a low level. The gain is used as an example here, but other parameters that affect the levels of defective pixels such as shutter speed and temperature may be referred to.

Second Embodiment

Next, the second embodiment of the present invention will be described with reference to FIGS. 11 and 12. In the second embodiment, the processing performed by the first defective pixel detection circuit 103 is different from the processing performed in the above-described first embodiment. Other than that, the second embodiment is similar to the first embodiment, and thus the processing performed by the first defective pixel detection circuit 103 in the second embodiment will be described hereinafter.

Figure 11:
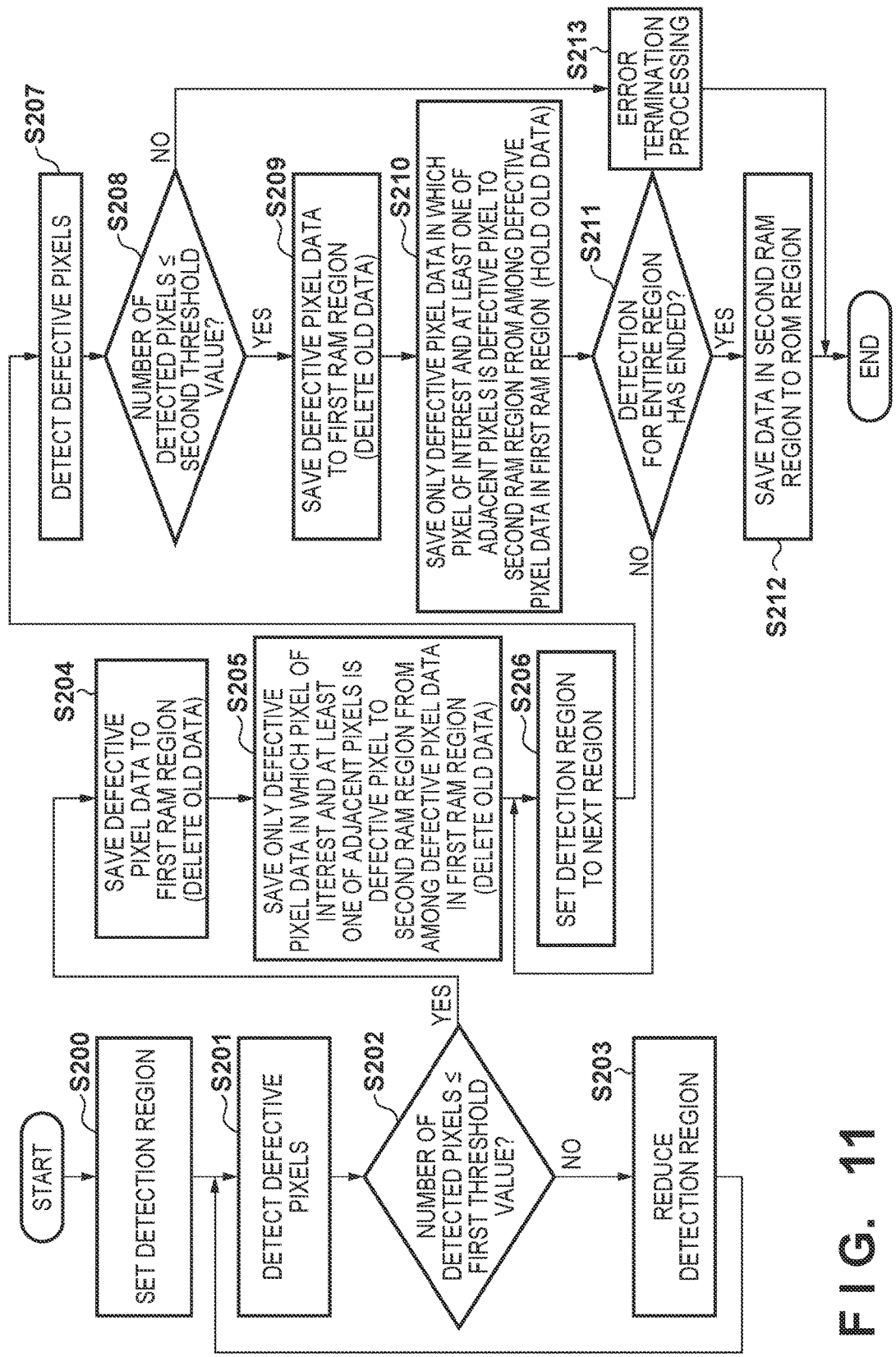
FIG. 11 is a flowchart of defective pixel detection processing by a third defective pixel detection method according to a second embodiment.
Figure 12:
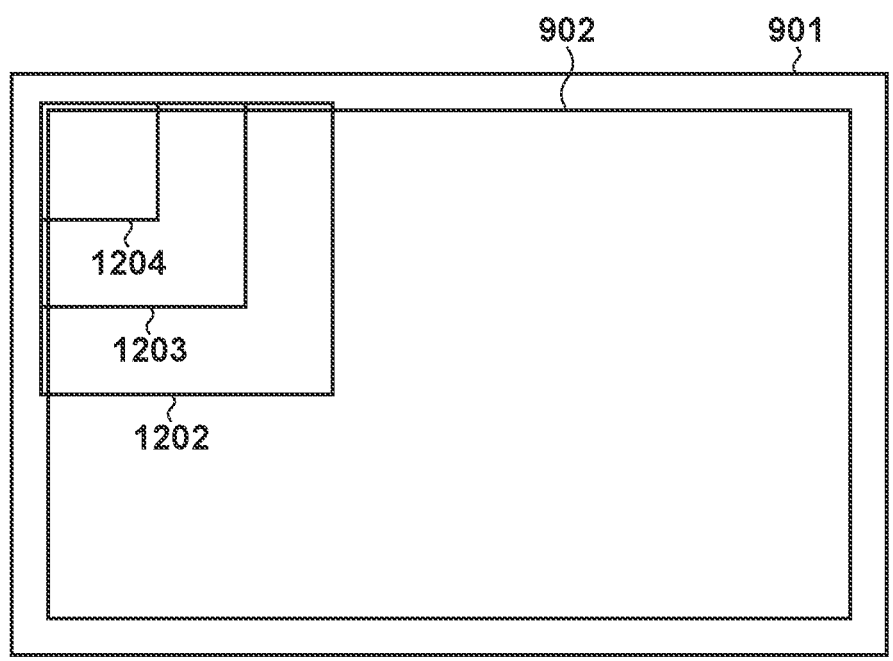
FIG. 12 is a diagram illustrating defective pixel detection regions according to the second embodiment.

FIG. 11 shows a flowchart of a third defective pixel detection method performed by the first defective pixel detection circuit 103 in the second embodiment. The third defective pixel detection method is performed in place of the first defective pixel detection method described above in the first embodiment. In step S200, first a region 1202 on the upper left shown in FIG. 12 is set as a detection region in an input image. In the next step S201, the first defective pixel detection circuit 103 detects defective pixels by sequentially performing the processing described in the first embodiment with reference to FIGS. 3A and 3B on each of the pixels of the detection region 1202 set in step S200.

In step S202, it is determined whether or not the number of defective pixels detected in step S201 is less than or equal to a first threshold value. In the case where the number of the detected defective pixels is more than the first threshold value, the procedure advances to step S203. In step S203, a range smaller than the currently set detection region is reset as the detection region. Specifically, in the case where the detection region 1202 is currently set, the detection region is reset to a detection region 1203, and in the case where the detection region 1203 is currently set, the detection region is reset to a detection region 1204. In this manner, the detection region is reduced until the number of detected defective pixels is smaller than or equal to the first threshold value. After the detection region is reset in step S203, the procedure advances to step S201, and defective pixel detection is performed again. If it is determined in step S202 that the number of detected defective pixels is less than or equal to the first threshold value, the procedure advances to step S204.

In step S204, the defective pixel data detected in step S201 is stored in the first RAM region 501 of the RAM 106. At this time, the data originally stored in the first RAM region 501 is deleted, and only the data detected in step S201 is stored. In step S205, defective pixel data in which the pixel of interest is a defective pixel and at least one of the adjacent pixels is a defective pixel, such as is shown in FIGS. 7A to 7D, is selected from among the defective pixel data in the first RAM region 501 of the RAM 106. Only the selected defective pixel data is then stored in the second RAM region 502 of the RAM 106. At this time, the data originally stored in the second RAM region 502 is deleted, and only the data selected in step S205 is stored.

In step S206, the detection region is set to the next region. Note that the setting method here is similar to that of step S104 in FIG. 8. Note that in the second embodiment, the detection region whose size is set in step S200 or the detection region whose size is reset in step S203 is sequentially shifted in the horizontal direction and in the vertical direction. In step S207, defective pixel detection is performed on the detection region set in step S206 in a similar manner to step S201.

In step S208, it is determined whether or not the number of the defective pixels detected in step S207 is less than or equal to a second threshold value. In the case where the number of the detected defective pixels is less than or equal to the second threshold value, the procedure advances to step S209. In step S209, the defective pixel data detected in step S207 is stored in the first RAM region 501 of the RAM 106. At this time, the data originally stored in the first RAM region 501 is deleted, and only the data detected in step S207 is stored. In step S210, defective pixel data in which the pixel of interest is a defective pixel and at least one of the adjacent pixels is a defective pixel, such as is shown in FIGS. 7A to 7D, is selected from among the defective pixel data in the first RAM region 501 of the RAM 106. Only the selected defective pixel data is then stored in the second RAM region 502 of the RAM 106. At this time, the data selected in step S210 is stored, in addition to any data originally stored in the second RAM region 502.

In step S211, it is checked whether or not defective pixel detection has ended for the entire region. In the case where defective pixel detection has not ended for the entire region, the procedure returns to step S206, where defective pixel detection is performed on the next detection region. In the case where it is determined in step S211 that defective pixel detection has ended for the entire region, the procedure advances to step S212, where the data in the second RAM region 502 of the RAM 106 is copied and stored in the ROM region 601 of the ROM 107, and the processing ends.

On the other hand, in the case where it is determined in step S208 that the number of the detected defective pixels is not less than or equal to the second threshold value, the procedure advances to step S213. In step S213, error termination processing such as storing error information is performed, and the processing ends.

In the above processing, the first threshold value in step S202 is set such that defective pixel data detected in defective pixel detection in step S201 is adequately stored in the first RAM region 501 of the RAM 106. On the other hand, the second threshold value in step S208 is set such that defective pixel data detected in defective pixel detection in step S207 is adequately stored in the first RAM region 501 of the RAM 106, and to be a higher value than the first threshold value.

As described above, according to the second embodiment, in the case where the number of defective pixels detected by the first defective pixel detection circuit 103 is high, the defective pixel detection region is set such that the amount of the defective pixel data is an amount that can be stored in the first RAM region 501 of the RAM 106. This makes it possible to reduce the number of times that the detection region is moved, in addition to effects similar to those of the first embodiment, and thus defective pixel detection is effectively performed, and the time required for defective pixel detection can be reduced.

Note that in the above first and second embodiments, a configuration in which defective pixel detection and defective pixel correction are performed in an image capturing apparatus was described as an example, but the present invention is not limited thereto. A configuration may be adopted in which RAW image data that has not undergone defective pixel correction is output from the image capturing apparatus, and defective pixel detection and correction are performed in an external apparatus such as a personal computer that has received this RAW image data. Accordingly, in this case, the external apparatus will be provided with the constituent elements from the defective pixel mark addition circuit 101 to the external output circuit 109 in FIG. 1, excluding the image sensor 100.

Note that the present invention is not limited to the above-described first and second embodiments, and various modifications that do not depart from the spirits of the invention are also included in the present invention. Some of the above-described embodiments may be combined as appropriate.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-178876, filed on Sep. 10, 2015 which is hereby incorporated by reference herein in its entirety.

What is claimed is:

1. An image processing apparatus comprising:
   a memory which stores an address of a defective pixel that satisfies a predetermined condition, among defective pixels included in an image sensor having a plurality of pixels covered with color filters; and
   a correction circuit which corrects, among pixel data of an image obtained by exposing the image sensor, the pixel data of the defective pixel at the address stored in the memory to generate a corrected image,
   wherein the defective pixel is a pixel having pixel data whose difference from a value determined using the pixel data of pixels surrounding the pixel is greater than a threshold value, and
   the predetermined condition includes at least one of a condition that a plurality of defective pixels, including the defective pixel, among pixels corresponding to different color filters are directly adjacent to each other, and a condition that a plurality of defective pixels, including the defective pixel, among pixels corresponding to the same color filter are directly adjacent to each other.

2. The image processing apparatus according to claim 1 further comprising a first defective pixel detection circuit which determines that a pixel of interest among the plurality of pixels is a defective pixel, when the pixel of interest has pixel data whose difference from a value determined using the pixel data of pixels surrounding the pixel of interest is greater than the threshold value, wherein the memory stores an address of a defective pixel that satisfies the predetermined condition, among the defective pixels determined by the first defective pixel detection circuit.

3. The image processing apparatus according to claim 2 further comprising a second defective pixel detection circuit which determines a defective pixel at an address that is not stored in the memory,
wherein the correction circuit corrects the pixel data of the defective pixel at the address stored in the memory and the pixel data of the defective pixel determined by the second defective pixel detection circuit.

4. The image processing apparatus according to claim 3, wherein the second defective pixel detection circuit determines a defective pixel using a second threshold value different from the threshold value.

5. The image processing apparatus according to claim 3, wherein the first defective pixel detection circuit performs defective pixel determination on pixel data of an image obtained by the image sensor being exposed in a state of being shielded from light or in a state of being irradiated with light having a uniform level, and
the second defective pixel detection circuit performs defective pixel determination on pixel data of an image exposed in order to capture an object.

6. The image processing apparatus according to claim 1 further comprising a defective pixel detection circuit which detects a defective pixel at an address that is not stored in the memory,
wherein the correction circuit corrects the pixel data of the defective pixel at the address stored in the memory and the pixel data of the defective pixel detected by the defective pixel detection circuit.

7. An image processing apparatus comprising:
a memory which stores an address of a defective pixel whose defective level is included in a predetermined range and that satisfies a predetermine condition, among defective pixels included in an image sensor having a plurality of pixels covered with color filters; and
a correction circuit which corrects, among pixel data of an image obtained by exposing the image sensor, the pixel data of the defective pixel at the address stored in the memory to generate a corrected image,
wherein the defective pixel is a pixel having pixel data whose difference from a value determined using the pixel data of pixels surrounding the pixel is greater than a threshold value, and
the predetermined condition includes at least one of a condition that a plurality of defective pixels, including the defective pixel, among pixels corresponding to different color filters are directly adjacent to each other, and a condition that a plurality of defective pixels, including the defective pixel, among pixels corresponding to the same color filter are directly adjacent to each other.

8. An image capturing apparatus comprising:
an image sensor which has a plurality of pixels covered with color filters;
a memory which stores an address of a defective pixel that satisfies a predetermined condition, among defective pixels included in the image sensor; and
a correction circuit which corrects, among pixel data of an image obtained by exposing the image sensor, the pixel data of the defective pixel at the address stored in the memory to generate a corrected image,
wherein the defective pixel is a pixel having pixel data whose difference from a value determined using the pixel data of pixels surrounding the pixel is greater than a threshold value, and
the predetermined condition includes at least one of a condition that a plurality of defective pixels, including the defective pixel, among pixels corresponding to different color filters are directly adjacent to each other, and a condition that a plurality of defective pixels, including the defective pixel, among pixels corresponding to the same color filter are directly adjacent to each other.

9. An image processing method comprising:
storing, in a memory, an address of a defective pixel that satisfies a predetermined condition, among defective pixels included in an image sensor having a plurality of pixels covered with color filters; and
correcting, among pixel data of an image obtained by exposing the image sensor, the pixel data of the defective pixel at the address stored in the memory to generate a corrected image,
wherein the defective pixel is a pixel having pixel data whose difference from a value determined using the pixel data of pixels surrounding the pixel is greater than a threshold value, and
the predetermined condition includes at least one of a condition that a plurality of defective pixels, including the defective pixel, among pixels corresponding to different color filters are directly adjacent to each other, and a condition that a plurality of defective pixels, including the defective pixel, among pixels corresponding to the same color filter are directly adjacent to each other.

10. An image processing method comprising:
storing, in a memory, an address of a defective pixel whose defective level is included in a predetermined range and that satisfies a predetermined condition, among defective pixels included in an image sensor having a plurality of pixels covered with color filters; and
correcting, among pixel data of an image obtained by exposing the image sensor, the pixel data of the defective pixel at the address stored in the memory to generate a corrected image,
wherein the defective pixel is a pixel having pixel data whose difference from a value determined using the pixel data of pixels surrounding the pixel is greater than a threshold value, and
the predetermined condition includes at least one of a condition that a plurality of defective pixels, including the defective pixel, among pixels corresponding to different color filters are directly adjacent to each other, and a condition that a plurality of defective pixels, including the defective pixel, among pixels corresponding to the same color filter are directly adjacent to each other.

11. The image processing apparatus according to claim 1, wherein the memory does not store an address of a defective pixel that does not satisfy the predetermined condition, among the defective pixels included in the image sensor.

* * * * *